United States Patent
Kliesch et al.

(10) Patent No.: US 7,261,944 B2
(45) Date of Patent: *Aug. 28, 2007

(54) ORIENTED, AMINOSILANE-COATED FILM CAPABLE OF STRUCTURING BY MEANS OF ELECTROMAGNETIC RADIATION AND COMPOSED OF THERMOPLASTIC POLYESTER FOR THE PRODUCTION OF SELECTIVELY METALLIZED FILMS

(75) Inventors: Holger Kliesch, Mainz (DE); Thorsten Kiehne, Wiesbaden (DE); Gottfried Hilkert, Saulheim (DE); Ingo Fischer, Heistenbach (DE)

(73) Assignee: Mitsubishi Polyester Film GmbH, Wiesbaden (DE)

( * ) Notice: Subject to any disclaimer, the term of this patent is extended or adjusted under 35 U.S.C. 154(b) by 409 days.

This patent is subject to a terminal disclaimer.

(21) Appl. No.: 10/941,722

(22) Filed: Sep. 15, 2004

(65) Prior Publication Data

US 2005/0064711 A1  Mar. 24, 2005

(30) Foreign Application Priority Data

Sep. 24, 2003 (DE) ................................ 103 44 511

(51) Int. Cl.
*B32B 27/08* (2006.01)
*B32B 27/18* (2006.01)
*B32B 27/20* (2006.01)
*B32B 27/28* (2006.01)
*B32B 27/36* (2006.01)

(52) U.S. Cl. .................... 428/447; 428/323; 428/328; 428/338; 428/480; 428/910; 428/446; 264/288.4; 264/290.2; 522/81; 522/83; 522/401; 522/402; 522/406; 524/434; 524/435; 524/439; 524/440

(58) Field of Classification Search .................... None
See application file for complete search history.

(56) References Cited

U.S. PATENT DOCUMENTS

| | | | | |
|---|---|---|---|---|
| 4,328,303 A | * | 5/1982 | Ronn et al. ................. 430/290 |
| 5,470,637 A | * | 11/1995 | Sakamoto et al. .......... 428/143 |
| 5,517,338 A | * | 5/1996 | Vaughn et al. ............... 359/15 |
| 5,728,339 A | * | 3/1998 | Farrar ........................ 264/134 |

(Continued)

FOREIGN PATENT DOCUMENTS

EP   0 359 017 A2   3/1990

(Continued)

OTHER PUBLICATIONS

Schimtz, Peter et al., "Films." Ullmann's Encyclopedia of Industrial Chemistry, 5th Ed., vol. A11 (1988), pp. 85-95, 105-06, 108-110.*

*Primary Examiner*—Vivian Chen
(74) *Attorney, Agent, or Firm*—ProPat, L.L.C.

(57) ABSTRACT

The invention relates to a single- or multilayer, oriented, film coated with an aminosilane compound and composed of polyester which comprises an additive which, on irradiation with electromagnetic radiation, forms metal nuclei on which further metal can be deposited in further steps of the process. The invention further relates to a process for producing this film and to its use in printed circuit boards, ribbon cables, smart cards, RFID labels, membrane keyboards, and film-based circuits of any type.

22 Claims, 1 Drawing Sheet

U.S. PATENT DOCUMENTS

| | | | |
|---|---|---|---|
| 7,083,848 B2* | 8/2006 | Kliesch et al. | 428/215 |
| 7,105,223 B2* | 9/2006 | Kliesch et al. | 428/331 |
| 7,112,365 B2* | 9/2006 | Kliesch et al. | 428/331 |
| 2002/0065346 A1* | 5/2002 | Murschall et al. | 524/323 |
| 2005/0163987 A1* | 7/2005 | Kliesch et al. | 428/220 |

FOREIGN PATENT DOCUMENTS

| | | |
|---|---|---|
| EP | 1 274 288 A1 | 1/2003 |
| JP | 7166034 A | 6/1995 |

\* cited by examiner

ORIENTED, AMINOSILANE-COATED FILM CAPABLE OF STRUCTURING BY MEANS OF ELECTROMAGNETIC RADIATION AND COMPOSED OF THERMOPLASTIC POLYESTER FOR THE PRODUCTION OF SELECTIVELY METALLIZED FILMS

CROSS REFERENCE TO RELATED APPLICATIONS

This application claims priority to German Patent Application 103 44 511.0, filed Sep. 24, 2003, hereby incorporated herein in its entirety.

FIELD OF THE INVENTION

The invention relates to a single- or multilayer, oriented, film coated with an aminosilane compound and composed of polyester which comprises an additive which, on irradiation with electromagnetic radiation, forms metal nuclei on which further metal can be deposited in further steps of the process. The invention further relates to a process for producing this film and to its use in printed circuit boards, ribbon cables, smart cards, RFID labels, membrane keyboards, and film-based circuits of any type.

BACKGROUND OF THE INVENTION

The use of polyester films for electrical insulation applications is prior art. The ever-more-stringent requirements relating to complexity of the circuits within a small space, together with the need to be able to produce these circuits rapidly, flexibly, and at low cost places stringent technological requirements on the film and on the steps within further processing.

Conventional processes for producing flexible circuits mostly relate to the full-surface metallization of the film web or lamination of the film web to metal foil and subsequent structuring of the resultant conductive surfaces by various processes, e.g. etching or mechanical removal of the undesired quantities of metal. There are also processes in which an embossment/print is applied to the metal, or a conductive paste composed of carbon/silver is applied. Disadvantages of these processes lie in their low flexibility and precision, which results in a relatively large separation between the conductor tracks, and/or the high costs associated with these processes, and/or the low production rates.

EP-A-1 274 288 describes a process in which laser irradiation is used to form copper nuclei from copper-containing metal oxides, and a subsequent electroplating step deposits further copper on the nuclei. That specification describes exclusively injection-molded parts, and there is no indication as to how and whether the process can be applied to polyester films and films generally. In particular, there is no indication of the nature of the polymers and additives needed to permit production of oriented films. The PBT/$SiO_2$/spinel compounded material described in EP-A-1 274 288 is unsuitable for producing oriented films because the high crystallization rate of the polybutylene terephthalate used and the high level of filling with fumed silica prevent reliable processing of this polymer.

In particular, there is no indication as to how it is possible to produce a film with adequate dimensional stability under conditions of local heating after irradiation with electromagnetic radiation and further processing.

SUMMARY OF THE INVENTION

It was an object of the present invention to provide a film which does not have the disadvantages mentioned and which comprises a compound activatable by radiation which forms metal nuclei on which further metal can be accumulated in further steps of the process in a manner that produces good adhesion between film and metal. A further object was that this film not only has low production cost and good orientability but also has good mechanical properties, i.e. high longitudinal and transverse tensile strength, high longitudinal and transverse modulus of elasticity, high longitudinal and transverse elongation at break, and high longitudinal and transverse tensile stress to generate a tensile strain of 5% (F5 value), together with defined shrinkage.

DETAILED DESCRIPTION OF THE INVENTION

Figure 1:
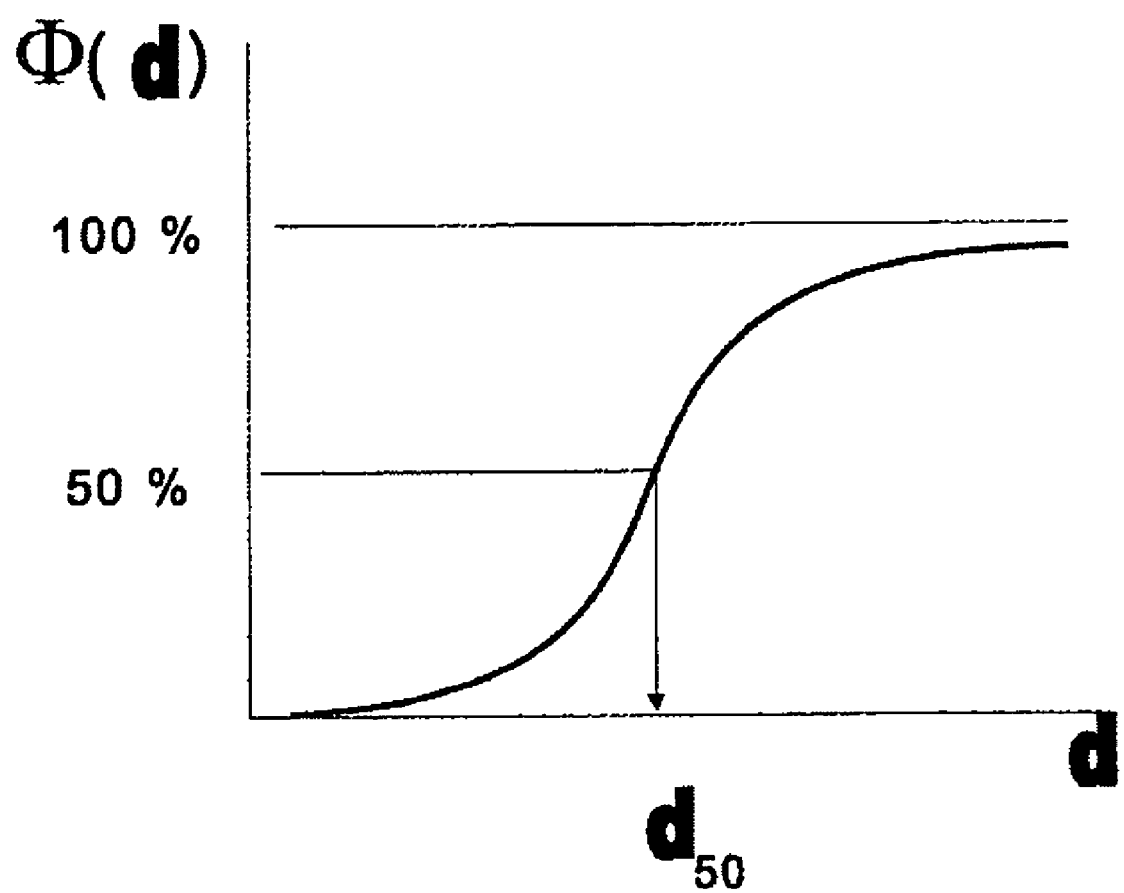
FIG. 1 is a graphical illustration of an exemplary particle size distribution curve.

This object is achieved via a single- or multilayer, at least monoaxially stretched polyester film with a total thickness of from 5 to 500 µm (preferably from 12 to 200 µm and particularly preferably from 30 to 150 µm), which, in at least one layer, comprises a metal compound capable of activation via electromagnetic radiation, its amount preferably being from 0.1 to 15% by weight (particularly preferably from 1.0 to 10% by weight and very particularly preferably from 2.0 to 8.0% by weight), based on the total weight of the modified layer, and which has an aminosilane coating on at least one side.

A metal compound capable of activation by radiation is a metal-containing (inorganic or organic) compound which as a consequence of absorbing electromagnetic radiation liberates metal in elemental form in a chemical reaction. This chemical reaction can also involve other reactants. It is also possible that the electromagnetic radiation is not directly absorbed by the metal-containing compound but by other substances which then transfer the absorbed energy to the metal-containing compound and thus bring about the liberation of elemental metal. The electromagnetic radiation may be UV light (wavelength from 100 to 400 nm), visible light (wavelength from 400 to 800 nm), or infrared light (wavelength from 800 to 25 000 nm), the use of infrared light being preferred. Other suitable forms of radiation are X-ray, gamma, and particle beam (electron beam, α-radiation, and β-radiation).

The accumulation of further metal onto the metal nuclei generated by electromagnetic radiation preferably takes place via electroplating (solution chemistry) processes.

Good adhesion between the deposited metal and the film means that it is impossible to remove the metal from the film, for example as a consequence of applying an adhesive strip and then peeling it away.

Good capability for orientation includes excellent capability of the film, during its production, to undergo mono-axial or biaxial orientation without break-offs.

The good mechanical properties include, inter alia, high modulus of elasticity in at least one film direction (longitudinal (MD) and/or transverse (TD)) greater than 500 N/mm², preferably greater than 2000 N/mm², and particularly pref erably greater than 4000 N/mm$^2$, and also high tensile strength values in at least one film direction (longitudinal (MD) and/or transverse (TD)) greater than 50 N/mm$^2$, preferably greater than 100 N/mm$^2$, and particularly preferably greater than 150 N/mm$^2$, and high elongation at break values in at least one film direction (longitudinal (MD) and/or transverse (TD)) greater than 10%, preferably greater than 40%, and particularly preferably greater than 80%.

In one preferred embodiment, the shrinkage of the inventive film at 200° C. is not greater than 25% in any film direction (MD or TD). Indeed, shrinkage at 200° C. is preferably smaller than 15%, and particularly preferably smaller than 5%.

The inventive film is based on polyesters. In particular, in the case of multilayer films, the base layer, and also the outer layers and/or intermediate layers, comprise a polyester as main polymer constituent (i.e. to an extent of from 55 to 100% by weight, preferably from 70 to 100% by weight, and particularly preferably from 90 to 100% by weight based on the weight of the respective layer).

According to the invention, a polyester is
a homopolyester,
a copolyester,
a blend of various polyesters, and these may be used either in the form of pure polymers or else in the form of polyesters comprising recycled material.

Polyesters contain repeat units which derive from dicarboxylic acids (100 mol %) and from diols (likewise 100 mol %). The inventive polyesters are preferably based on terephthalic acid or 2,6-naphthalenedicarboxylic acid as dicarboxylic acid and on ethylene glycol as diol.

In particular, the inventive polyesters contain from 10 to 100 mol % of terephthalate or from 10 to 100 mol % of 2,6-naphthalate as dicarboxylic acid components (the total amount of dicarboxylic acid components making up 100 mol %). Other dicarboxylic acid components which may be present in the inventive polyester are from 0 to 50 mol % of 2,6-naphthalate (if terephthalate was used as main component), from 0 to 50 mol % of terephthalate (if naphthalate was used as main component), from 0 to 20 mol % of isophthalate (preferably from 0.5 to 4 mol %), and also from 10 to 60 mol % of 4,4'-diphenyldicarboxylate. Other dicarboxylic acid components, such as 1,5-naphthalenedicarboxylate, should not exceed a proportion of 30 mol %, preferably 10 mol %, in particular 2 mol %.

As diol component, the inventive polyester contains from 10 to 100 mol % of ethylene glycol (EG) (the entire amount of diol components making up 100 mol %). The proportion of diethylene glycol should not exceed 10 mol %, and is ideally from 0.5 to 5 mol %. Other diol components, such as cyclohexanedimethanol, 1,3-propanediol, 1,4-butanediol should not exceed a proportion of 50 mol %, their proportion preferably being less than 30 mol %, particularly preferably less than 10 mol %.

The polyester composition of functional outer layers may deviate from that which has been described above and is described by way of example below in the paragraph concerning sealable outer layers.

Besides the main polymer constituents, other embodiments of the layers of the film may contain up to 45% by weight (preferably up to 30% by weight, particularly preferably up to 20% by weight, based on the weight of the respective film layer) of other polymers, such as polyetherimides (e.g. ®Ultem 1000 from GE Plastics Europe, NL), polycarbonate (e.g. ®Makrolon from Bayer, DE), polyolefins, such as COCs (e.g. ®Topas from Ticona, DE), polyamides (®Ultramid from BASF, DE), etc.

The polyesters are generally prepared by processes known from the literature from the dicarboxylic acid or dicarboxylic ester and the diols mentioned. The polyesters may either be prepared by the transesterification process using the usual catalysts, e.g. salts of Zn, of Ca, of Li, or of Mn, or by the direct esterification process.

The inventive film may have one or more layers. Multilayer films are composed of a base layer B, of at least one outer layer A or C, and, where appropriate, of other intermediate layers, particular preference being given to a three-layer A-B-A or A-B-C structure. For this embodiment it is advantageous for the polymer of the base layer B to have a melt viscosity similar to that of the polymer(s) of the outer layer(s) adjacent to the base layer.

In one possible embodiment, the functional layer C is sealable. This sealable outer layer, applied via coextrusion to the base layer B, advantageously has a structure based on polyester copolymers. For the purposes of the invention, there are two preferred variants here: either copolyester composed of terephthalic acid and isophthalic acid, or copolyester composed of terephthalic acid and naphthalene-dicarboxylic acid.

The polymer of the sealable outer layer is then composed of copolyesters which are predominantly, i.e. to an extent of at least from 70 to 95 mol %, composed of either isophthalic acid components or naphthalenedicarboxylic acid components and terephthalic acid components in the dicarboxylic acid category and from 70 to 95 mol % of ethylene glycol components in the diol category. The remaining monomer units derive from the other aliphatic, cycloaliphatic, or aromatic diols and, respectively, dicarboxylic acids that can also occur in the base layer.

The thickness of the outer layer(s) is selected independently of the other layers, and is preferably in the range from 0.1 to 10 μm, in particular from 0.2 to 5 μm, preferably from 1 to 3 μm, and the thickness and composition of outer layers applied here on the two sides may be identical or different. The thickness of the base layer can therefore be calculated from the difference between the total thickness of the film and the thickness of the outer and intermediate layer(s) applied, and may therefore vary within wide boundaries, in the same way as the total thickness.

The compound capable of activation by radiation is composed of electrically non-conductive high-thermal-stability organic or inorganic metal compounds which are preferably not soluble and stable in aqueous acidic or alkaline metallizing baths. Particularly suitable compounds are those which have maximum light absorption, in particular in the IR region. Compounds of this type are described in EP-A-1 274 288. Preference is given here to compounds of metals of the d- and f-group of the Periodic Table of the Elements with non-metals. The metal-containing compounds are particularly preferably metal oxides, in particular monooxides of the d-metals of the Periodic Table of the Elements. Higher metal oxides are particularly suitable. In one particularly preferred embodiment of the invention, the higher oxides are spinels, in particular copper-containing spinels, such as $CuCr_2O_4$. Suitable copper-containing spinels are commercially available, an example being PK 3095 from Ferro (DE) or 34E23 or 34E30 from Johnson Matthey (DE).

The concentration of these compounds present in the inventive film is from 0.1 to 15% by weight, preferably from 1.0 to 10% by weight, and particularly preferably from 2.0 to 8.0% by weight. This total concentration may be distributed here over two or more layers of the film, but the total amount is preferably added to the outer layers, preferably to one of the outer layers.

If the metal-containing compound is insoluble in the polyester used to produce the film, the particles have an average size ($d_{50}$ value) of from 0.01 to 20 µm, preferably from 0.05 to 10 µm, and particularly preferably from 0.1 to 5 µm.

It was more than surprising here that use of the compound described and capable of activation by radiation to modify the film's exclusively outer layer(s), which is/are thin in relation to the total thickness of the film, is fully sufficient to obtain a film capable of structuring via electromagnetic radiation and suitable for the applications mentioned. A particular economic advantage here is that the amount of the compound capable of activation by radiation needed to produce the inventive film is considerably smaller than it would be if the base layer or the entire film were also modified.

One or more layers of the inventive film may comprise other particulate additives, such as fillers and antiblocking agents. Typical fillers and antiblocking agents are inorganic and/or organic particles, such as silicon dioxide (precipitated or fumed), calcium carbonate, magnesium carbonate, barium carbonate, calcium sulfate, barium sulfate, lithium phosphate, calcium phosphate, magnesium phosphate, titanium dioxide (rutile or anatase), kaolin (hydrated or calcined), aluminum oxide, aluminum silicates, lithium fluoride, the calcium, barium, zinc or manganese salts of the dicarboxylic acids used, or crosslinked polymer particles, e.g. polystyrene or polymethyl methacrylate particles.

It is also possible to select mixtures of two or more of the abovementioned particle systems or mixtures of particle systems with identical chemical composition but different particle size. The particles are advantageously added to the polyester before melting begins.

If further particulate additives are present in a layer of the film, the total concentration of these particles is less than 30% by weight, based on the total weight of the modified layer, preferably less than 25% by weight, and particularly preferably less than 20% by weight. The average size ($d_{50}$ value) of the particulate additives is from 0.01 to 15 µm, preferably from 0.03 to 10 µm, and particularly preferably from 0.05 to 1 µm. In one preferred embodiment, the proportion of particles with $d_{50}$>3 µm is smaller than 2000 ppm, and particularly preferably <1000 ppm.

It has been found that films without further additives (other than the active metal component) can also be used according to the invention. However, the formation of the metal nuclei is improved if at least one layer of the film comprises, as filler, silicon dioxide in the abovementioned amounts and particle sizes. For the formation of the metal nuclei, it has proven particularly advantageous for the film layer(s) modified with the component capable of activation by radiation also to comprise from 0.1 to 30% by weight, preferably from 0.5 to 25% by weight, and particularly preferably from 1 to 20% by weight (based on the total weight of the modified layer) of silicon dioxide particles with $d_{50}$<1 µm.

The inventive film may comprise other additives, such as UV stabilizers, flame retardants, hydrolysis stabilizers, and antioxidants.

In another embodiment, at least one layer of the inventive film is flame-retardant. Flame-retardant means that in what is known as a fire protection test to UL94 VTM the film achieves at least the classification VTM-2. One or more layers of the film then comprise(s) a flame retardant at a concentration in the range from 0.2 to 30% by weight, preferably from 0.5 to 25% by weight, particularly preferably from 1.0 to 20% by weight, based on the weight of the modified layer. It is important that the flame retardant is soluble in the polyester, because otherwise the required mechanical properties are not achieved. Examples of suitable flame retardants are organobromine, -chlorine or -nitrogen compounds, or metal hydroxides or metal oxide trihydrates. However, the halogen compounds have the disadvantage that toxic and corrosive hydrogen halides are produced in the event of a fire. Another disadvantage is the low light-resistance of a film equipped therewith. Examples of other suitable flame retardants are organophosphorus compounds, such as carboxyphosphinic acids, their anhydrides, and dimethyl methanephosphonate. Very suitable flame retardants here are those in which the phosphorus compound has chemical bonding to the polyester. Very particular preference is given to bis(2-hydroxyethyl) [(6-oxido-6H-dibenz[c,e][1,2]oxaphosphorin-6-yl)methyl]butanedicarboxylate of the formula

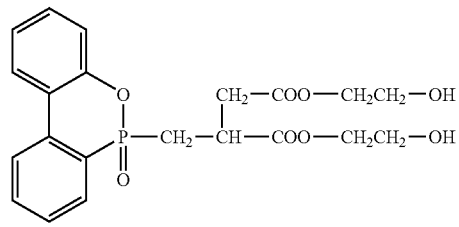

In this preferred embodiment, the inventive low-flammability film comprises, besides the polyester, the compound capable of activation by radiation and, if appropriate, particulate additives, from 1 to 20% by weight of an organophosphorus compound as flame retardant soluble in the polyester.

Because the flame retardants generally have some susceptibility to hydrolysis, it may also be advisable to add a hydrolysis stabilizer. Examples of suitable hydrolysis stabilizers are polymeric carbodiimides, e.g. ®Stabaxol P from Rheinchemie (DE). The amount of these preferably used is from 0.1 to 1.0% by weight (based on the weight of the modified layer).

These abovementioned proportions of flame retardant and hydrolysis stabilizer have also proven advantageous when the main constituent of the film is not polyethylene terephthalate but another polyester.

The compound capable of activation by radiation and any other additives used, such as particles, UV stabilizers, flame retardants, hydrolysis stabilizers, and antioxidants, may be added in the form of a glycolic dispersion during the polycondensation process to the polyester used for the production of the inventive film. However, it is preferable to add the component capable of activation by radiation and/or any other additives used by way of masterbatches to the polyester during film extrusion.

According to the invention, at least one surface of the film is coated with an aqueous solution or, respectively, dispersion of a hydrolyzed aminosilane compound. The coating is preferably applied in-line, i.e. during the film production process, advantageously prior to transverse stretching. Particular preference is given to applying the coating by means of reverse gravure roll coating, which can apply the coating extremely homogeneously. Preference is also given to applying the coating by the Meyer rod process, which can achieve relatively high coating thicknesses. The coating is applied in the form of a dilute aqueous solution or, respectively, dispersion to the film, and then the solvent or dispersion medium is evaporated. If the coating is applied in-line prior to transverse stretching, the heat treatment during transverse stretching is generally sufficient to evaporate the solvent or dispersion medium and to dry the coating.

Suitable aminosilane compounds have, in the unhydrolyzed state, the general formula

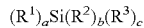

where $R^1$ is a functional group having at least one primary amino group, and is preferably a group having the formula —X—Y—Z—NH$_2$, where X=C1-C4-alkylene or C6-C10-arylene, Y=O, NH, or a bond, Z=C1-C4-alkylene or C6-C10-arylene, and $R^2$ is a hydrolyzable group selected from the group consisting of an alkoxy group having from 1 to 8 carbon atoms, an acetoxy group, and a halide, and $R^3$ is an unreactive, non-hydrolyzable group selected from the group consisting of an alkyl group having from 1 to 8 carbon atoms and a phenyl group. The coefficient a is greater than or equal to 1, the coefficient b is likewise greater than or equal to 1, and the coefficient c is greater than or equal to 0, and a+b+c=4.

N-(2-Aminoethyl)-3-aminopropyltrimethoxysilane of the formula

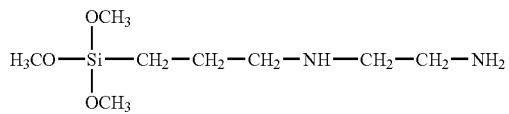

is preferred as aminosilane compound. This compound is supplied commercially by Dow Corning (DE) with the name Z-6020.

The inventive coating described above has been described in detail in EP-B-359 017, which is expressly incorporated herein by way of reference. That specification also describes other suitable aminosilane compounds which, although they are not given here, are expressly encompassed by the present invention.

It was highly surprising that a film which comprises at least one compound capable of activation by radiation and which has been coated with an amount of from 0.5 to 100 mg/m$^2$ (preferably from 2 to 50 mg/m$^2$, and particularly preferably from 10 to 25 mg/M$^2$) of the dried residue of a hydrolyzed aminosilane compound exhibits, after activation and then deposition of metal on the coated side, markedly improved adhesion of the metal to the film.

In order to establish further properties, the film may also be coated on the side not coated with hydrolyzed aminosilane compounds. Typical coatings are layers with adhesion-promoting, antistatic, slip-improving, or release action. Clearly, these additional layers may be applied to the film by way of in-line coating, by means of aqueous dispersions, after longitudinal stretching and prior to transverse stretching.

For particular applications it can be advantageous to use an acid for chemical pretreating of that surface of the film which has not been coated with hydrolyzed aminosilane compounds. Particularly suitable compounds for this "etching" process to promote adhesion are trichloroacetic acid, dichloroacetic acid, or hydrofluoric acid, which act for a short time (from 5 to 120 seconds) on the surface, and then are removed by an air knife. This gives the film a very reactive, amorphous surface.

A commercially available twin-screw extruder (e.g. from Coperion) can be used to introduce the additives, i.e. the metal compound capable of activation by radiation, and also any further fillers present and other additives, into the polymer. Here, inventive polyester pellets are introduced together with the particles/additives into the extruder and are extruded, then quenched in a waterbath, and then pelletized.

However, in one preferred process for preparing the inventive polyesters, the additives are added directly during the preparation of the polyester. In the case of the DMT process, the additives are usually added in the form of a glycolic dispersion after the transesterification or directly prior to the polycondensation (e.g. by way of the transport line between transesterification and polycondensation vessels). However, the addition may also take place prior to the start of the transesterification. In the case of the TPA process, the addition preferably takes place at the start of the polycondensation. However, later addition is also possible. In the case of this process it has proven advantageous to filter the glycolic dispersions through a PROGAF PGF 57 (Hayward Ind., USA) filter prior to addition.

The present invention also provides a process for producing the film. Production usually takes place via an extrusion or coextrusion process known per se. It has proven particularly advantageous to add the component capable of activation by radiation and any other additives used, such as particles, UV stabilizers, flame retardants, hydrolysis stabilizers, and antioxidants, in the form of predried or precrystallized masterbatches, prior to the extrusion process.

In masterbatch technology it is preferable that the particle size and the bulk density of the masterbatches are similar to the particle size and the bulk density of the polyester used, thus achieving homogeneous distribution, resulting in homogeneous properties.

The polyester films may be produced in the form of a single- or multilayer film by known processes from a polyester and, if appropriate, from other raw materials, at least one component capable of activation by radiation, and also, if appropriate, other additives.

Masterbatches which comprise the component capable of activation by radiation have preferably been precrystallized and/or predried. The same applies to masterbatches which comprise particles, UV stabilizer(s), flame retardants, and/or other additives. The predrying includes progressive heating of the masterbatches under reduced pressure (from 20 to 80 mbar, preferably from 30 to 60 mbar, in particular from 40 to 50 mbar), with stirring, and, if appropriate, afterdrying at a constant elevated temperature (likewise under reduced pressure). It is preferable for the masterbatches to be charged batchwise at room temperature from a feed vessel in the desired blend together with the polyester and, if appropriate, with other raw material components into a vacuum dryer in which the temperature profile moves from 10 to 160° C., preferably from 20 to 150° C., in particular from 30 to 130° C., during the course of the drying time or residence time. During the residence time of about 6 hours, preferably 5 hours, in particular 4 hours, the raw material mixture is stirred at from 10 to 70 rpm, preferably from 15 to 65 rpm, in particular from 20 to 60 rpm. The resultant precrystallized or predried raw material mixture is afterdried in a downstream vessel, likewise evacuated, at temperatures of from 90 to 180° C., preferably from 100 to 170° C., in particular from 110 to 160° C., for from 2 to 8 hours, preferably from 3 to 7 hours, in particular from 4 to 6 hours.

In the preferred extrusion process for producing the film, the polymer material is melted with the additives of the individual layers in an extruder. The melt(s) is (are simultaneously) extruded through a flat-film die, and quenched in the form of a substantially amorphous prefilm.

This prefilm is then reheated and oriented in at least one direction—either in machine direction (MD) or in transverse direction (TD)—however preferably longitudinally and transversely, or transversely and longitudinally, or longitudinally, transversely, and again longitudinally and/or transversely. The film temperatures in the stretching process are generally above the glass transition temperature Tg of the polyester used by from 10 to 60° C., and the longitudinal stretching ratio is usually from 2.0 to 6.0, in particular from 3.0 to 4.5, the transverse stretching ratio usually being from 2.0 to 5.0, in particular from 3.0 to 4.5, the ratio for any second longitudinal and transverse stretching carried out usually being from 1.1 to 5.0. The longitudinal stretching may also be carried out simultaneously with the transverse stretching (simultaneous stretching) or in any conceivable sequence.

The heat-setting of the film follows at oven temperatures of from 180 to 260° C., in particular from 220 to 250° C. The film is then cooled and wound.

In one preferred embodiment, the heat-setting takes place at from 220 to 250° C., and the film is relaxed transversely at this temperature by at least 1% (preferably at least 2%).

In another preferred embodiment, the heat-setting takes place at from 220 to 250° C., and the film is relaxed transversely at this temperature by at least 1% (preferably at least 2%), and then again transversely relaxed, again by at least 1% (preferably at least 2%) at temperatures of from 180 to 150° C. in the cooling phase.

In another preferred embodiment, the film is stretched in MD and TD by a factor of at least 3.0, this stretching taking place in a simultaneous frame. The heat-setting takes place at from 220 to 250° C., and the film is longitudinally and transversely relaxed by at least 1% at this temperature.

The inventive films have the required good mechanical properties. For example, the modulus of elasticity in at least one film direction (longitudinal (MD) and/or transverse (TD)) is at least 500 N/mm$^2$, preferably at least 2000 N/mm$^2$, and particularly preferably at least 4000 N/mm$^2$. The tensile strength values in at least one film direction (longitudinal (MD) and/or transverse (TD)) are greater than 50 N/mm$^2$, preferably greater than 100 N/mm$^2$, and particularly preferably greater than 150 N/mm$^2$. The elongation at break values in at least one film direction (longitudinal (MD) and/or transverse (TD)) are greater than 10%, preferably greater than 40%, and particularly preferably greater than 80%.

The shrinkage of the inventive film at 200° C. is not greater than 25% in any film direction (MD or TD). Indeed, shrinkage at 200° C. is smaller than 15%, and preferably smaller than 5%.

It was more than surprising that use of the additives described and of the coating with a hydrolyzed aminosilane compound, where appropriate combined with suitable predrying and/or precrystallization of the raw materials and with the process conditions described can produce, without technical problems (such as caking in the dryer or break-offs) a single- or multilayer film which has the required property profile and is capable of activation by electromagnetic radiation. During the production process, no, or hardly any, deposits on the dies or evolution of gasses were observed, the result being that the inventive film has excellent mechanical properties, excellent optical properties, an excellent profile, and excellent layflat. It has excellent capability for orientation, and can therefore be produced reliably and cost-effectively, and once the film has been activated with electromagnetic radiation and then metallized it exhibits good adhesion between metal and film.

It is moreover very surprising that it is also possible to reuse the recycled material from the coated film without adversely affecting the mechanical and electrical properties of the film. Within the bounds of accuracy of measurement, there is no adverse effect on electrical and mechanical properties even in comparison with an unmodified film.

The combined properties of the inventive films make them suitable for a wide variety of applications, for example for printed circuit boards, ribbon cables, smart cards, RFID labels, membrane keyboards, and film-based circuits of any type.

The invention is further illustrated below using examples, but is not restricted thereto.

The individual properties are measured here to the following standards or by the following methods.

Test Methods

Mechanical properties

Modulus of elasticity, tensile strength, elongation at break, and F5 value are measured longitudinally and transversely to ISO 527-1-2 with the aid of tensile strain measurement equipment (Zwick 010, Ulm, DE).

Shrinkage

Thermal shrinkage was determined on square film samples with an edge length of 10 cm. The samples are measured precisely (edge length $L_0$) and heat-conditioned for 15 minutes at 200° C. in a convection oven. The specimens are removed and measured precisely at room temperature (edge length L). Shrinkage is given by the equation shrinkage [%]=100·($L_0$–L)/L Standard Viscosity (SV) and Intrinsic Viscosity (IV)

Standard viscosity was measured—by a method based on DIN 53726—on a 1% strength solution in dichloroacetic acid (DCA) at 25° C.

SV (DCA)=($\eta_{rel}$–1)×1000. Intrinsic viscosity (IV) is calculated as follows from standard viscosity (SV)

IV=[η]=6907·10$^{-4}$SV(DCA)+0.063096 [dl/g]

Measurement of Average Diameter $d_{50}$

Average diameter $d_{50}$ was determined by means of a laser on a Malvern Mastersizer by the standard method (an example of other measurement equipment being the Horiba LA 500 or Sympathec Helos, which use the same principle of measurement). For this, the specimens were placed with water in a cell, which was then placed in the measurement equipment. The measurement procedure is automatic and also includes the mathematical determination of $d_{50}$ values. The $d_{50}$ value here is defined as the value determined from the (relative) cumulative particle size distribution curve: the point of intersection of the 50% ordinate value with the cumulative curve immediately gives the desired $d_{50}$ value on the abscissa axis. FIG. 1 provides a graphical illustration of an exemplary particle size distribution and $d_{50}$ value determination.

Seal Seam Strength

To determine seal seam strength, two film strips of width 15 mm were mutually superposed and sealed at 130° C. with a sealing time of 0.5 s and a sealing pressure of 2 bar, using NDS equipment from Brugger Feinmechanik (Munich, DE), using a single-side heated sealing jaw. Seal seam strength was determined by the T-peel method, with the aid of tensile strain measurement equipment (Zwick 010, Ulm, DE). The two strip ends here are clamped into the opposite clips and separated at a velocity of 200 mm/min. The maximum force measured during this process is the seal seam strength and is stated in N/15 mm.

Film Production

Polyester chips were mixed in the ratios stated in the examples and precrystallized in a fluidized-bed dryer at 155° C. for 1 minute, and then dried for 3 hours in a tower dryer at 150° C., and melted in a single-screw extruder at 290° C. The molten polymer extrudates were brought together in a coextrusion die and drawn off by way of a take-off roll (roll temperature 20° C.). The film was stretched by a factor of 3.5 in the machine direction at 116° C. (film temperature in the stretching gap). After a corona treatment, one side of the film was then coated with aqueous aminosilane dispersion by means of reverse gravure coating (conditions: 2.0% by weight of Z-6020 from Dow Corning (DE) in deionized water, wet application weight: 2.5 g/m$^2$, corresponding to a dry application weight of 16 mg/m$^2$). Transverse stretching by a factor of 3.2 was carried out in a frame at 110° C. The film was then heat-set at 229° C. and relaxed transversely by 1% at temperatures of from 229 to 200° C. and again by 1% at temperatures of from 180 to 150° C. The production speed (final film speed) is 300 m/min.

The final film thickness is 50 μm.

EXAMPLES

The following raw materials are used in the examples:

Masterbatch MB1:
10% by weight of PK3095 from Ferro and 90% by weight of polyethylene terephthalate (PET)

Masterbatch MB2:
10% by weight of PK3095 from Ferro and 90% by weight of polybutylene terephthalate (PBT)

Masterbatch MB3:
4% by weight of Aerosil TT600 SiO$_2$ particles from Degussa (Germany) ($d_{50}$ of agglomerates about 300 nm; primary particle $d_{50}$ about 50 nm) and 96% by weight of polyethylene terephthalate (PET)

Masterbatch MB4:
4% by weight of Aerosil TT600 SiO$_2$ particles from Degussa (Germany) ($d_{50}$ of agglomerates about 300 nm; primary particle $d_{50}$ about 50 nm) and 96% by weight of polybutylene terephthalate (PBT)

Masterbatch MB5:
4% by weight of Omyacarb BP CaCO$_3$ particles from Omya (USA) ($d_{50}$ of particles 22 μm) and 96% by weight of polyethylene terephthalate (PET)

Masterbatch MB6:
10% by weight of PK3095 from Ferro and 90% by weight of polyethylene naphthalate (PEN)

Masterbatch MB7:
4% by weight of Aerosil TT600 SiO$_2$ particles from Degussa (Germany) ($d_{50}$ of agglomerates about 300 nm; primary particle $d_{50}$ about 50 nm) and 96% by weight of polyethylene naphthalate (PEN)

Masterbatch MB8:
4% by weight of Hydrocarb 70 CaCO$_3$ particles with a $d_{50}$ value of 1.6 μm (Omya) (Germany) and 96% by weight of polyethylene terephthalate (PET)

Masterbatch MB9:
Masterbatch MB9 comprises 6% by weight of M-Ester from Sanko Co. Ltd. (CAS No. 63562-34-5) and 94% by weight of polyethylene terephthalate from KoSa.

Polymer P1:
100% by weight of RT49 polyethylene terephthalate from KoSa (Germany)

Polymer P2:
25% by weight of Aerosil 90 from Degussa (Germany), 5% by weight of PK3095 from Ferro, and 70% by weight of polybutylene terephthalate (PBT)

Polymer P3:
100% by weight of polybutylene terephthalate

Polymer P4:
100% by weight of polyethylene naphthalate

Example 1

50% by weight of MB1 are mixed with 25% by weight of MB3 and 25% by weight of P1, and further processed as stated above to give a monofilm coated on one side film. Properties can be found in Table 1.

Example 2

Example 1 is repeated, but also using 50% by weight of recycled material produced from the film from Example 1. Properties can be found in Table 1.

Example 3

50% by weight of MB1 are mixed with 50% by weight of P1, and further processed as stated above to give a monofilm coated on one side film. Properties can be found in Table 1.

Example 4

An ABA film coated on one side, with a base layer thickness of 46 μm and outer layers A each of 2 μm is produced as stated above.

Polymer mixture for outer layers A: 50% by weight of MB1; 25% by weight of MB3; 25% by weight of P1

Polymer mixture for base layer B: 100% by weight of P1

The properties of the film can be found in Table 1.

Example 5

An ABC film coated on one side, with a base layer thickness of 46 μm and outer layers A and C each of 2 μm is produced as stated above.

Polymer mixture for outer layer A: 50% by weight of MB1; 25% by weight of MB3; 25% by weight of P1

Polymer mixture for base layer B: 100% by weight of P1
Polymer mixture for outer layer C: 25% by weight of MB3; 75% by weight of P1
The properties of the film can be found in Table 1.

Example 6

An ABA film coated on one side, with a base layer thickness of 46 μm and outer layers A each of 2 μm is produced as stated above.
Polymer mixture for outer layer A: 50% by weight of MB1; 25% by weight of MB3; 25% by weight of P1
Polymer mixture for base layer B: 25% by weight of MB9; 75% by weight of P1
The film was subjected to an UL94 VTM fire test and achieved fire classification VTM-0.
The other properties of the film can be found in Table 1.

Example 7

An ABC film coated on the A side with a base layer thickness of 47 μm, an outer layer A of 2 μm and a sealable outer layer C of 1 μm is prepared as stated above.
Polymer mixture for outer layer A: 50% by weight of MB1; 25% by weight of MB3; 25% by weight of P1
Polymer mixture for base layer B: 100% by weight of P1
Polymer mixture for outer layer C: 100% by weight of P6
The seal seam strength of the film (C-side/C-side) was 2.5 N/15 mm. The other properties of the film can be found in Table 1.

Comparative Example 1

Using polymer P2 (similar to the polymer from the example from EP-A-1 274 288), attempt was made to produce a film coated on one side as stated above. It proved to be impossible to orientate the film, because every attempt at stretching led to break-offs. It was impossible to produce a film.

Comparative Example 2

Example 1 is repeated, but the film is not coated. Properties can be found in Table 1.

Comparative Example 3

60% by weight of MB1 are mixed with 40% by weight of MB5 and further processed as stated above to give a film coated on one side. Only small amounts could be produced, because break-offs often occurred during stretching. Cost-effective production of the film is impossible. Properties can be found in Table 1.

Comparative Example 4

50% by weight of MB1 are mixed with 25% by weight of MB3 and 25% by weight of P1 and further processed as stated above to give a film coated on one side. However, the heat-setting does not take place as described above at 229° C., but at 150° C., and no relaxation took place. Properties can be found in Table 1.

Conductor Track Production:

In the region of the conductor tracks to be applied, the aminosilane-coated side of the films produced was irradiated with infrared laser radiation generated by a diode-pumped Nd:YAG laser (in this case a Microline 3D IR 160 from LPKF AG (Germany)), using an intensity which generates very little ablation, associated with structured metal nucleation. After brief treatment in an ultrasound cleaning bath containing demineralized water, the film is passed through a commercially available chemically reductive copper-plating bath. Here, the conductor tracks are constructed in the irradiated regions.

Results of Conductor Track Production:

The conductor tracks generated were assessed visually by means of an optical microscope (incident light) at 20× magnification. The coherence of the copper layer was evaluated visually, and allocated to the following categories: good, less good, and poor. To assess the adhesion of the metal deposited on the film, a conductor track (length: 2.5 cm; width: 3 mm) was produced as described above via activation and subsequent copper plating. An adhesive strip (®Scotch Tape 600 from 3M, USA) was then adhesive-bonded transversely across the conductor track. The adhesive strip was peeled away at an angle of 90° with respect to the film surface, at a constant velocity of 0.2 cm/s. The adhesive strip was inspected under an optical microscope (incident light) at 20× magnification. If no separated copper was visible on the adhesive surface, the adhesion of the copper on the film was evaluated as "adequate" (+), and otherwise the adhesion was "inadequate" (−).

TABLE 1

| Example | MD modulus of elasticity in N/mm² | TD modulus of elasticity in N/mm² | MD tensile strength in N/mm² | TD tensile strength in N/mm² | MD elongation at break in % | TD elongation at break in % | MD shrinkage 200° C. | TD shrinkage 200° C. | Conductor track production | Copper adhesion |
|---|---|---|---|---|---|---|---|---|---|---|
| 1 | 4200 | 5300 | 190 | 280 | 170 | 110 | 4.2 | 2.7 | good | + |
| 2 | 4200 | 5400 | 185 | 282 | 165 | 115 | 4.3 | 2.0 | good | + |
| 3 | 4100 | 5500 | 172 | 278 | 163 | 100 | 4.5 | 2.3 | less good | + |
| 4 | 4400 | 5700 | 192 | 295 | 167 | 105 | 3.9 | 1.5 | good | + |
| 5 | 4000 | 5100 | 181 | 240 | 177 | 117 | 4.6 | 3.1 | good | + |
| 6 | 3900 | 4800 | 162 | 210 | 181 | 119 | 5.2 | 3.3 | good | + |
| 7 | 4800 | 6100 | 210 | 300 | 155 | 95 | 3.5 | 1.9 | good | + |

TABLE 1-continued

|  | MD modulus of elasticity in N/mm² | TD modulus of elasticity in N/mm² | MD tensile strength in N/mm² | TD tensile strength in N/mm² | MD elongation at break in % | TD elongation at break in % | MD shrinkage 200° C. | TD shrinkage 200° C. | Conductor track production | Copper adhesion |
|---|---|---|---|---|---|---|---|---|---|---|
| Comparative Example |  |  |  |  |  |  |  |  |  |  |
| 1 | no film obtained | no film obtained | no film obtained | no film obtained | no film obtained | no film obtained | no film obtained | no film obtained | no film obtained | no film obtained |
| 2 | 4000 | 5100 | 182 | 275 | 178 | 112 | 4 | 2.3 | poor | — |
| 3 | 4300 | 5200 | 45 | 37 | 19 | 31 | 4.6 | 3.0 | good | + |
| 4 | 4100 | 5500 | 180 | 287 | 185 | 108 | 25 | 29 | good*) | + |

*)Creases formed after laser irradiation

The invention claimed is:

1. A single- or multilayer, at least monoaxially oriented polyester film with a total thickness of from 5 to 500 μm, which comprises a metal compound which on irradiation with electromagnetic radiation liberates a metal in elemental form within the polyester and which has, at least on one of its surfaces, an aminosilane coating, said film exhibiting a modulus of elasticity in at least one film direction (longitudinal (MD) and/or transverse (TD)) of greater than 500 N/mm².

2. The polyester film as claimed in claim 1, wherein the metal compound is a metal oxide.

3. The polyester film as claimed in claim 1, wherein the metal compound is a spinel.

4. The polyester film as claimed in claim 1, wherein the metal compound is $CuCr_2O_4$.

5. The polyester film as claimed in claim 1, wherein the amount of the metal compound present in the film is from 0.1 to 15.0% by weight.

6. The polyester film as claimed in claim 1, which comprises particulate additives.

7. The polyester film as claimed in claim 1, wherein the aminosilane coating uses an aminosilane which in the unhydrolyzed state has the formula $$(R^1)_a Si(R^2)_b (R^3)_c$$

where $R^1$ is a functional group having at least one primary amino group, where X=C1-C4-allcylene or C6-C10-arylene, Y=O, NH, or a bond, Z=C1-C4-alkylene or C6-C10-arylene, and $R^2$ is a hydrolyzable group selected from the group consisting of an alkoxy group having from 1 to 8 carbon atoms, an acetoxy group, and a halide, and $R^3$ is an unreactive, non-hydrolyzable group selected from the group consisting of an alkyl group having from 1 to 8 carbon atoms and a phenyl group, and the coefficient a is greater than or equal to 1, the coefficient b is likewise greater than or equal to 1, and the coefficient c is greater than or equal to 0, and a+b+c=4.

8. The polyester film as claimed in claim 7, wherein $R^1$ is a group having the formula —X—Y—Z—NH₂.

9. The polyester film as claimed in claim 1, wherein at least one layer is composed of a polyester which contains, as dicarboxylic acid component, from 10 to 100 mol % of terephthalate, based on the total amount of the dicarboxylic acid components present.

10. The polyester film as claimed in claim 1, wherein at least one layer is composed of a polyester which contains, as dicarboxylic acid component, from 10 to 100 mol % of 2,6-naphthalate, based on the total amount of the dicarboxylic acid components present.

11. The polyester film as claimed in claim 1, which has tensile strength values in at least one film direction (longitudinal (MD) and/or transverse (TI))) of greater than 50N/mm².

12. The polyester film as claimed in claim 1, which has elongation at break values in at least one film direction (longitudinal (MD) and/or transverse (TD)) of greater than 10 N/mm².

13. The polyester film as claimed in claim 1, which does not have shrinkage greater than 25% at 200° C. in any film direction (MD or TD).

14. The polyester film as claimed in claim 1, which has at least two layers and is composed at least of one base layer and one outer layer.

15. The polyester film as claimed in claim 14, wherein the metal compound is present in one of the layers of the multilayer film.

16. The polyester film as claimed in claim 14, wherein the metal compound is present in the outer layer(s) of the multilayer film.

17. The polyester film as claimed in claim 14, wherein one of the outer layers is sealable.

18. The polyester film as claimed in claim 1, which has at least three layers and is composed at least of one base layer and two outer layers.

19. A process for producing a polyester film as claimed in claim 1, which comprises extruding, together through a slot die, a polyester and a metal compound which on irradiation with electromagnetic radiation liberates a metal in elemental form within the polyester, cooling, reheating, and then orienting in at least one direction, then coating one surface with a hydrolyzed aminosilane, and then heat-setting.

20. Printed circuit boards, ribbon cables, smart cards, RFID labels, membrane keyboards, and film-based circuits comprising a film as claimed in claim 1.

21. A multilayer film comprising a metal compound which on irradiation with electromagnetic radiation liberates metal in elemental form, said film exhibiting a modulus of elasticity in at least one film direction (longitudinal (MD) and/or transverse (TD)) of greater than 500 N/mm².

22. Printed circuit boards, ribbon cables, smart cards, RFID labels, membrane keyboards or film-based circuits comprising a film as claimed in claim 21.

* * * * *

UNITED STATES PATENT AND TRADEMARK OFFICE
CERTIFICATE OF CORRECTION

PATENT NO. : 7,261,944 B2  Page 1 of 1
APPLICATION NO. : 10/941722
DATED : August 28, 2007
INVENTOR(S) : Kliesch et al.

It is certified that error appears in the above-identified patent and that said Letters Patent is hereby corrected as shown below:

Column 15
Claim 7, Line 45, delete "allcylene" insert -- alkylene --

Column 16
Claim 11, Line 23, delete "(TI)))" insert -- (TD)) --

Signed and Sealed this

Thirteenth Day of November, 2007

JON W. DUDAS
*Director of the United States Patent and Trademark Office*